United States Patent
Su et al.

(10) Patent No.: US 7,215,014 B2
(45) Date of Patent: May 8, 2007

(54) SOLDERABLE METAL FINISH FOR INTEGRATED CIRCUIT PACKAGE LEADS AND METHOD FOR FORMING

(75) Inventors: Peng Su, Austin, TX (US); Sheila F. Chopin, Austin, TX (US); Nhat D. Vo, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 10/901,844

(22) Filed: Jul. 29, 2004

(65) Prior Publication Data

US 2006/0022313 A1   Feb. 2, 2006

(51) Int. Cl.
H01L 23/495   (2006.01)

(52) U.S. Cl. ..................................... 257/677

(58) Field of Classification Search ................ 257/666, 257/677, 750
See application file for complete search history.

(56) References Cited

U.S. PATENT DOCUMENTS

| | | | | |
|---|---|---|---|---|
| 3,459,642 | A * | 8/1969 | Schafler et al. | 205/112 |
| 3,972,787 | A * | 8/1976 | Nobel et al. | 205/265 |
| 4,529,667 | A * | 7/1985 | Shiga et al. | 428/646 |
| 5,454,929 | A * | 10/1995 | Kinghorn | 205/128 |
| 5,741,544 | A * | 4/1998 | Mahulikar | 427/236 |
| 5,767,574 | A * | 6/1998 | Kim et al. | 257/677 |
| 6,087,714 | A * | 7/2000 | Kubara et al. | 257/666 |
| 6,180,999 | B1 * | 1/2001 | Abbott | 257/666 |
| 6,335,107 | B1 * | 1/2002 | Abys et al. | 428/680 |
| 6,376,901 | B1 * | 4/2002 | Abbott | 257/666 |
| 6,469,386 | B1 * | 10/2002 | Lee et al. | 257/748 |
| 6,545,344 | B2 * | 4/2003 | Abbott | 257/666 |
| 6,583,500 | B1 * | 6/2003 | Abbott et al. | 257/666 |
| 6,646,330 | B2 * | 11/2003 | Kubara et al. | 257/677 |
| 6,706,561 | B2 * | 3/2004 | Abbott | 438/123 |
| 6,713,852 | B2 * | 3/2004 | Abbott et al. | 257/677 |
| 6,849,574 | B1 * | 2/2005 | Heidemann et al. | 502/330 |
| 6,891,253 | B2 * | 5/2005 | Miyaki et al. | 257/666 |

(Continued)

OTHER PUBLICATIONS

Burstner et al. , "The Hot-Dip Tinning Process for Lead-Free Electrical Connections", Mar. 1997, CARTS '97 Symposium.*

(Continued)

*Primary Examiner*—Lex Malsawma
(74) *Attorney, Agent, or Firm*—Joanna G. Chiu; James L. Clingan, Jr.

(57) ABSTRACT

A packaged integrated circuit includes a die surrounded by an encapsulant in which leads are used to electrically connect the die, which is internal to the encapsulant, externally. The leads have a primary metal that is used for electrical conduction and physical support. The external portion of the lead is coated with another metal, typically tin, that is useful for soldering. This tin layer is formed in a manner that ensures that it is porous. Although porous is generally thought to be a bad characteristic, it turns out to be very effective in absorbing stress and thus retarding whisker growth. Whisker growth, which can short adjacent leads together as well as cause other deleterious effects, has been a major source of failures in packaged integrated circuits. An additional layer of very thin tin that is non-porous can be added before or after the porous tin layer has been deposited.

32 Claims, 1 Drawing Sheet

U.S. PATENT DOCUMENTS

2004/0237282 A1* 12/2004 Hines .................. 29/527.2

OTHER PUBLICATIONS

NEMI Tin Whisker Users Group ; "Tin Whisker Acceptance Test Requirements"; Jul. 1, 2004; pp. 1-20.

NEMI Tin Whisker User Groups; "Interim Recommendations on Lead-Free Finishes for Components Used in High-Reliability Products"; Mar. 2004; pp. 1-10.

Galyon; Dr. George T.; "Annotated Tin Whisker Bibliography and Anthology"; Nov. 2003; pp. 1-63; Version 1.0; NEMI.

* cited by examiner

SOLDERABLE METAL FINISH FOR INTEGRATED CIRCUIT PACKAGE LEADS AND METHOD FOR FORMING

FIELD OF THE INVENTION

This invention relates generally to integrated package leads, and more specifically, to solderable metal finishes for package leads.

RELATED ART

In semiconductor processing, an integrated circuit may be packaged to provide external connections via, for example, package leads. The package leads are used to provide electrical connections from the integrated circuit which may then be used to electrically couple the integrated circuit to, for example, a printed circuit board (PCB). These package leads are typically finished to form a solderable surface so that the package leads may be soldered onto the PCB. The finish may also provide protection for the package leads from, for example, corrosion and oxidation. In one process used today, stress may be introduced into the finish thus resulting in whiskers or filaments which extend from the package leads. The whiskers may grow to a length which causes shorts between the leads and/or to other sites on the PCB (once mounted onto the PCB). The whiskers may also result in other deleterious effects and has been a major source of failures in packaged integrated circuits. Therefore, a need exists for an improved solderable finish which reduces or prevents the formation of such whiskers.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Embodiments of the present invention relate to a porous solderable metal finish for integrated circuit package leads which reduces or prevents whiskering of the metal finish. In one embodiment, a porous metal finish including, for example, tin (Sn) is used to finish or coat the package metal leads. The parameters used for the formation of this finish results in a porous metal finish, where the porosity may be controlled and determined by controlling these parameters. Alternatively, the porous metal finish may include other metals or combination of metals in addition to or instead of tin. The porosity of the metal finish relieves stress in the metal finish and thus retards whisker growth, thereby resulting in an improved packaged IC.

Figure 1:
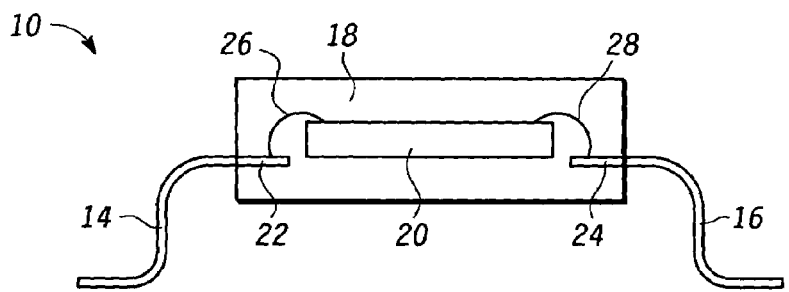
FIG. 1 illustrates a packaged integrated circuit in accordance with one embodiment of the present invention.

FIG. 1 illustrates a packaged integrated circuit (IC) 10 in accordance with one embodiment of the present invention. Packaged IC 10 includes an integrated circuit die 20 surrounded by an encapsulant 18. IC die 20 is electrically coupled to package leads 14 and 16 via wire bonds 26 and 28, respectively, and wire bond posts 22 and 24, respectively. Therefore, for example, a bond pad of IC die 20 (not shown) may be provided as a connection external to encapsulant 18 via wire bond 26, wire bond post 22, and electrical lead 14. Thus package lead 14 may be soldered onto a PCB to provide electrical connections from IC die 20 to the PCB (not shown). Therefore, integrated circuit 10 may include any number of package leads as needed to provide external electrical connects for the bond pads of IC die 20. The formation of IC die 20, encapsulant 18, wire bonds 26 and 28, and wire bond posts 22 and 24 are known in the art and therefore will not be described in further detail herein. Package leads 14 and 16 are finished with a solderable metal to provide solderable package leads. The finish may also protect package leads 14 and 16 from corrosion and oxidation. In one embodiment, package leads 14 and 16 are finished with a porous solderable metal finish such that whiskering is reduced or prevented. The porous solderable metal finish will be described further below in reference to FIGS. 2–4. (Note that package leads 14 and 16 may also be referred to as external leads since they are external to encapsulant 18.)

Note that IC package 10 may include more or less elements, as needed, and may include any number of IC die such as IC die 20. Also, note that packaged IC 10 of FIG. 1 provides only one example of a packaged IC. That is, IC die 20 may be packaged in a variety of other known ways which still use package leads such as package leads 14 and 16 for external electrical connections. For example, IC die 20 may be packaged as a quad flat package (QFP), quad flat no lead package (QFN), a plastic dual inline package (PDIP), small outline package (SOP, SOIC), plastic leaded chip carrier (PLCC), etc. Furthermore, the package leads such as package leads 14 and 16 may be trimmed and bent into a variety of different forms, such as the form illustrated in FIG. 1, or other forms, such as a "J" bend. Alternatively, the package leads may not be bent. Therefore, any of these types of packages includes package leads which may be finished using a porous metal finish, such as the porous metal finish that will be described in reference to package lead 14 in FIGS. 2–4.

Figure 2:
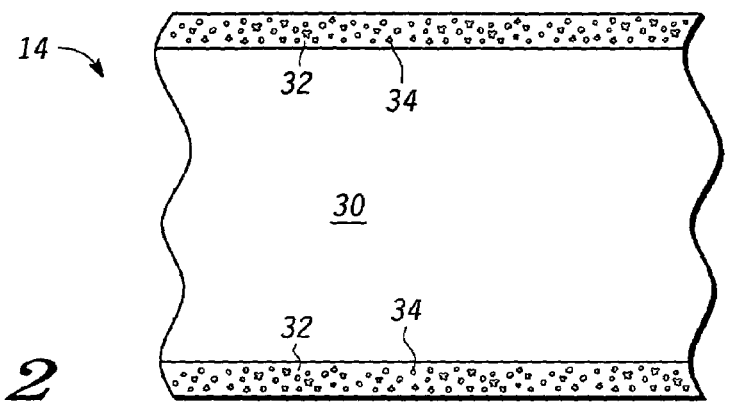
FIGS. 2–4 illustrates cross-sectional views of the integrated circuit package leads of FIG. 1 in accordance with various embodiments of the present invention.

FIG. 2 illustrates a cross section of a portion of package lead 14 having a conductive lead 30 (which, in the illustrated example, is an extension of wire bond post 22 external to encapsulant 18) and a porous solderable metal finish 32 which coats conductive lead 30, in accordance with one embodiment of the present invention. In one embodiment, conductive lead 30 includes copper; however, alternatively, conductive lead 30 may include another metal or metals. Conductive lead 30 may also be referred to as a metal lead, metal substrate, or primary metal and is used for electrical conduction and physical support. Therefore, note that each lead of packaged IC 10 has an external portion that is external to encapsulant 18 (such as, for example, conductive lead 30 which is coated with metal finish 32 to form package lead 14) and an internal portion that is internal to encapsulant 18 (such as, for example, wire bond post 22). Porous metal finish 32 (which may also be referred to as metal finish 32) includes a variety of pores, such as pore 34, which may have a variety of shapes and sizes. As used herein, a pore has a dimension across of at least approximately one micron, and the pores of porous metal finish 32 make up, on average, at least approximately 5 percent of the volume of metal finish 32 along the length of package lead 14, i.e. metal finish 32 has an average porosity of at least approximately 5 percent. Note that, as used herein, a material is considered porous if it has an average porosity of at least approximately 5 percent and non-porous if it has an average porosity of less than approximately 5 percent. In one embodiment, metal finish 32 has an average porosity of at least approximately 10 percent, or, more preferably, in a range of approximately 20 to 30 percent.

In one embodiment, metal finish 32 has a thickness sufficient to coat the outer surface of conductive lead portion 30. Note that after the package leads are singulated, as illustrated in FIG. 1, metal finish 32 may not coat the cut surfaces, such as, for example, at the ends of the package leads. In one embodiment, metal finish 32 has a thickness of at least approximately 5 microns, or alternatively, at least approximately 9 microns. Alternatively, metal finish 32 may have a thickness in a range of approximately 5 to 25 microns, or more preferably, 5 to 15 microns. In one embodiment, the pores have a distance across at a largest diameter that is less than the thickness of metal finish 32. In one embodiment, the pores of metal finish 32 are not greater than approximately 5 microns across. In one embodiment, the pores may be substantially uniformly located throughout metal finish 32.

Note that the density and sizes of pores may be controlled by adjusting the parameters used in forming metal finish 32. In one embodiment, the density and size of the pores is controlled such that a number of adjacent pores do not create an opening in metal finish 32 which exposes portions of conductive lead portion 30. Alternatively, pores which expose portions of conductive lead portion 30 may be created. However, upon mounting the packaged IC to a PCB, the package leads are reflowed, where the reflowed metal finish may coat the previously exposed portions of conductive lead portion 30.

In one embodiment, metal finish 32 is a porous tin finish. Alternatively, metal finish 32 may be a tin alloy such as, for example, tin-silver, tin-bismuth, tin-copper, and tin-zinc. Alternatively, other metals or combination of metals may be used for metal finish 32, where metal finish 32 may include, for example, tin, aluminum, silver, cadmium, zinc, combinations thereof, or alloys of these metals. In one embodiment, metal finish 32 is formed by plating metal finish 32 onto conductive lead portion 30 prior to trimming and forming of package lead 14. For example, packaged IC 10 of FIG. 1 may be placed into a plating bath and brought through the plating bath to plate the metal leads of packaged IC 10 with porous metal finish 32. (Note that after the plating, the metal leads of packaged IC 10 may be trimmed and formed to form package leads 14 and 16 of FIG. 1.) The parameters or conditions of the plating process used to form metal finish 32, such as, for example, plating bath temperature, belt speed (i.e. speed through the plating bath), current density, and concentration of the majority metal intended for metal finish 32 within the plating bath, may be varied to control the porosity of metal finish 32. For example, in one embodiment, a plating bath temperature of approximately 40 degrees Celsius, a belt speed of approximately 60 mm/s, and a current density of approximately 13 amps/decimeter$^2$ may be used to plate metal finish 32. Alternatively, other combinations of parameter values may be used in which lower temperatures and/or higher belt speeds may be used. For example, in one embodiment, the plating bath temperature is less than approximately 50 degrees Celsius and the belt speed is greater than approximately 50 mm/s, where at least one of the following criterion is met: the belt speed is at least approximately 60 mm/s and the temperature is not greater than approximately 40 degrees Celsius. Also, note that the current density used may not affect porosity of metal finish 32 as much as the combination of bath temperature and belt speed; therefore, other current density values may be used while still allowing for the desired porosity of metal finish 32.

As stated above, other values may be used for bath temperature and belt speed. For example, in one embodiment, the plating bath temperature may be at most approximately 60 degrees Celsius, or alternatively, at most approximately 43 degrees Celsius, or, more preferably, in a range of approximately 37 to 43 degrees Celsius. In one embodiment, the belt speed may be at least, approximately, 50 milimeters/second (mm/s), or, alternatively, at least approximately 55, or, more preferably, in a range of approximately 55 to 65 mm/s. Note that, in one embodiment, if a higher temperature is used, a faster belt speed may be needed to achieve the desired porosity of metal finish 32. Also, note that in different embodiments, the concentration of the majority metal intended for metal finish 32 within the plating bath may also be varied. For example, in the case of metal finish 32 being a porous tin or tin-alloy finish, the concentration of tin in the plating bath may be varied. Furthermore, note that the concentration of additives, in addition to the majority metal, may also be varied to possibly affect the porosity of metal finish 32.

Note that in alternate embodiments, metal finish 32 may be formed using other plating methods, such as, for example, electroless plating or fountain plating, where, for example, parameters of these methods may be varied to control the porosity of metal finish 32.

Figure 3:
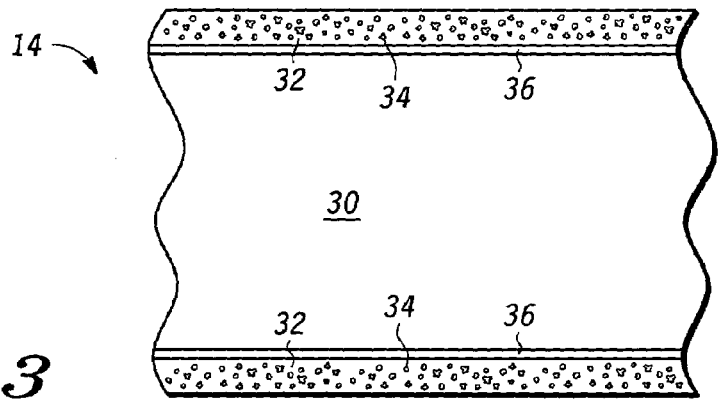

FIG. 3 illustrates a portion of package lead 14 in accordance with an alternate embodiment of the present invention. The embodiment of FIG. 3 is similar to that of FIG. 2 (in which like numbers indicate like elements); however, the embodiment of FIG. 3 includes an additional metal layer 36 between conductive lead 30 and metal finish 32. Metal layer 36 is less porous than metal finish 32. In one embodiment, metal layer 36 is non-porous, i.e. has an average porosity of less than 5 percent. In one embodiment, metal finish 32 is thicker than metal layer 36. For example, the thickness of metal finish 32 may be approximately four times thicker than metal layer 36, or alternatively, may be approximately nine times thicker than metal layer 36. In one embodiment, metal layer 36 may include nickel, silver, or tin, etc, or an alloy of any of these metals. Metal layer 36 may be formed by plating metal (e.g. electroplating or electroless plating) onto conductive lead portion 30. In an alternate embodiment, a non-metal layer may be used in place of metal layer 36. For example, an organic coat or protectant may be used. In this example, metal finish 32 may be electroless plated onto the organic coat.

Figure 4:
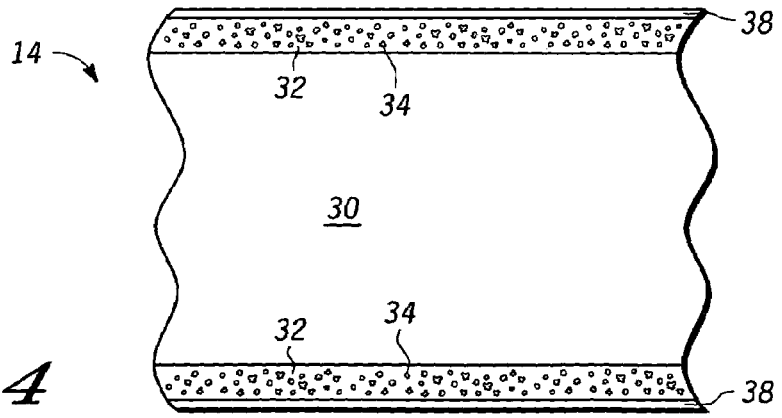

FIG. 4 illustrates a portion of package lead 14 in accordance with yet another alternate embodiment of the present invention. The embodiment of FIG. 4 is similar to the embodiment of FIG. 3; however, metal layer 36 is not present, and instead, a metal layer 38 is present over metal finish 32, such that metal finish 32 is between metal layer 38 and conductive lead portion 30. The descriptions provided above with respect to the composition and thickness of metal layer 36 also apply to metal layer 38. Metal layer 38 may also be formed by plating metal (e.g. electroplating or electroless plating) onto metal finish 32. Also, note that a non-metal layer may be used in place of metal layer 38, such as, for example, an organic coat or protectant.

In yet another alternate embodiment, package lead 14 may include two additional metal layers such as both metal layer 36 and metal layer 38. In this manner, metal finish 32 would be located between two metal layers. Alternatively, organic coats may be used in place of the metal layers, such that metal finish 32 is located between two organic coats.

By now it should be appreciated that there has been provided a porous metal finish for package leads which reduce or prevent the formation of whiskers while maintaining solderability of the package leads, where the porous metal finish includes an average porosity of at least 5 percent. The porosity of metal finish 32 may allow for stress relief of the metal finish, thus reducing or preventing the formation of whiskers. Therefore, although porous is generally thought to be a bad characteristic, it turns out to be very effective in absorbing stress and thus retarding whisker growth. Whisker growth, which can short adjacent leads together as well as cause other deleterious effects, has been a major source of failures in packaged integrated circuits. The porosity may be controlled by controlling the parameters or conditions of the plating process used to form metal finish 32. For example, different combinations of plating bath temperature and belt speed may be used to achieve different porosities.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

The term "plurality", as used herein, is defined as two or more than two. The term another, as used herein, is defined as at least a second or more.

The invention claimed is:

1. An external lead of a packaged integrated circuit comprising:
   a metal substrate; and
   a first layer of metal that coats the metal substrate, wherein the entire first layer of metal is porous and comprises at least one of tin, cadmium, aluminum, and zinc.

2. The external lead of claim 1, further comprising a second layer of metal that coats the metal substrate, wherein the second layer of metal is non-porous.

3. The external lead of claim 2 wherein the first layer of metal is between the second layer of metal and the metal substrate.

4. The external lead of claim 2, wherein the second layer is between the first layer of metal and the metal substrate.

5. The external lead of claim 2, wherein the first layer of metal is thicker than the second layer of metal.

6. The external lead of claim 5, wherein the first layer of metal is at least four times thicker than the second layer of metal.

7. The external lead of claim 5, wherein the first layer of metal is at least about nine times thicker than the second layer of metal.

8. The external lead of claim 1, wherein the first layer of metal has a thickness greater than five microns.

9. The external lead of claim 8, wherein the thickness of the first layer of metal is at least about nine microns.

10. The external lead of claim 1, wherein the first layer of metal comprises pores that are not greater than about 5 microns across.

11. The external lead of claim 1, wherein:
    the first layer of metal has a thickness; and
    the first layer of metal is characterized by having pores that have a distance across at the largest dimension that is less than the thickness of the first layer of metal.

12. The external lead of claim 1, wherein the entire first layer of metal has an average porosity of between about twenty percent and thirty percent.

13. The external lead of claim 1, wherein the first layer of metal comprises tin.

14. The external lead of claim 13, wherein the first layer of metal further comprises a metal selected from at least one of zinc, copper, bismuth, and silver.

15. The external lead of claim 1, wherein the entire first layer of metal has an average porosity of at least about ten percent.

16. A packaged integrated circuit comprising:
    an integrated circuit die surrounded by an encapsulant;
    a plurality of leads, each lead having external portion that is external to the encapsulant and an internal portion that is internal to the encapsulant, wherein:
       the internal portion is electrically connected to the integrated circuit die; and
       the external portion comprises a metal substrate and a first metal layer, wherein the entire first metal layer is porous and coats the metal substrate, and wherein the first metal layer comprises at least one of tin, cadmium, aluminum, and zinc.

17. The packaged integrated circuit of claim 16, wherein the first metal layer comprises tin.

18. The packaged integrated circuit of claim 17, wherein the first layer of metal has a thickness greater than five microns.

19. The packaged integrated circuit of claim 18, wherein the thickness of the first layer of metal is at least about nine microns.

20. The packaged integrated circuit of claim 17, wherein the first layer of metal comprises pores that are not greater than about 5 microns across.

21. The packaged integrated circuit of claim 17, wherein:
the first layer of metal has a thickness; and
the first layer of metal is characterized by having pores that have a distance across at the largest dimension that is less than the thickness of the first layer of metal.

22. The packaged integrated circuit of claim 17, wherein the entire first layer of metal has an average porosity of between about twenty percent and thirty percent.

23. The packaged integrated circuit of claim 17, wherein the first layer of metal further comprises a metal selected from at least one of zinc, copper, bismuth, and silver.

24. A packaged integrated circuit comprising:
an integrated circuit die surrounded by an encapsulant;
a plurality of leads, each lead having external portion that is external to the encapsulant and an internal portion that is internal to the encapsulant, wherein:
the internal portion is electrically connected to the integrated circuit die; and
the external portion comprises a metal substrate and a first metal layer that is porous and that coats the metal substrate, wherein the first metal layer comprises tin; and
a second layer of metal that coats the metal substrate, wherein the second layer of metal is non-porous tin.

25. The packaged integrated circuit of claim 24 wherein the first layer of metal is between the second layer of metal and the metal substrate.

26. The packaged integrated circuit of claim 24, wherein the second layer is between the first layer of metal and the metal substrate.

27. The packaged integrated circuit of claim 24, wherein the first layer of metal is thicker than the second layer of metal.

28. The packaged integrated circuit of claim 24, wherein the first layer of metal is at least four times thicker than the second layer of metal.

29. The packaged integrated circuit of claim 24, wherein the first layer of metal is at least about nine times thicker than the second layer of metal.

30. A packaged integrated circuit comprising:
an integrated circuit die surrounded by an encapsulant;
a plurality of leads, each lead having external portion that is external to the encapsulant and an internal portion that is internal to the encapsulant, wherein:
the internal portion is electrically connected to the integrated circuit die; and
the external portion comprises a metal substrate and a first metal layer that is porous and that coats the metal substrate, wherein the first metal layer comprises at least one of tin, cadmium, aluminum, silver, and zinc, and wherein the entire first layer of metal has an average porosity of at least about ten percent.

31. The packaged integrated circuit of claim 30, wherein the entire first layer of metal has an average porosity of between about twenty percent and thirty percent.

32. The packaged integrated circuit of claim 30, wherein the first layer of metal comprises tin.

* * * * *